United States Patent [19]
Ohashi

[11] Patent Number: 5,133,452
[45] Date of Patent: Jul. 28, 1992

[54] IC PACKAGE STORAGE CONTAINER

[75] Inventor: Yasuhide Ohashi, Suwa, Japan

[73] Assignee: Seiko Epson Corporation, Japan

[21] Appl. No.: 580,842

[22] Filed: Sep. 11, 1990

[30] Foreign Application Priority Data

Sep. 12, 1989 [JP] Japan .............................. 1-106974[U]

[51] Int. Cl.$^5$ ....................... B65D 73/02; B65D 85/42
[52] U.S. Cl. .................................... 206/328; 206/334;
357/74; 361/220
[58] Field of Search ................... 206/334, 328; 357/74,
357/75, 84; 361/393, 220; 174/52.4

[56] References Cited

U.S. PATENT DOCUMENTS

| | | | |
|---|---|---|---|
| 4,463,851 | 8/1984 | Cecil | 206/328 |
| 4,565,288 | 1/1986 | Walther | 206/328 |
| 4,702,371 | 10/1987 | Hoshi et al. | 206/328 |
| 4,711,350 | 12/1987 | Yen | 206/328 |

FOREIGN PATENT DOCUMENTS 43911 12/1989 Japan .
0001123 12/1979 World Int. Prop. O. .......... 206/334

Primary Examiner—Rolf Hille
Assistant Examiner—David Ostrowski
Attorney, Agent, or Firm—W. Douglas Carothers, Jr.

[57] ABSTRACT

An IC package storage container has a conductive tubular-shaped body within which is housed a plurality of IC packages and includes a non-conductive transparent window in one wall of the body. Conductive protrusions or projections are formed on and integral with the inside of the tubular-shaped body and extend into the interior of the container body to be in close proximity with a surface of the IC packages. The protrusions formed on adjacent sides of the transparent window and arranged substantially parallel thereto for the length of the container body. The length of the protrusions are such that they concurrently prevent substantial lateral shifting and rotational orientation of the IC packages within the tubular-shaped container body and prevent contact with the transparent window.

2 Claims, 2 Drawing Sheets

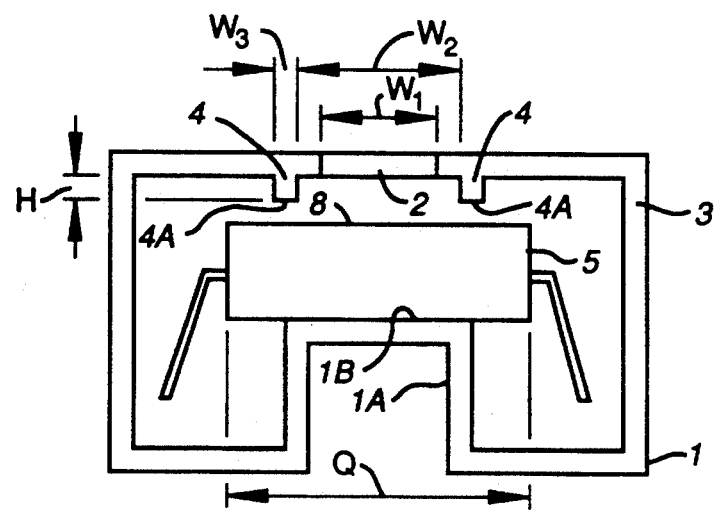
FIG._1
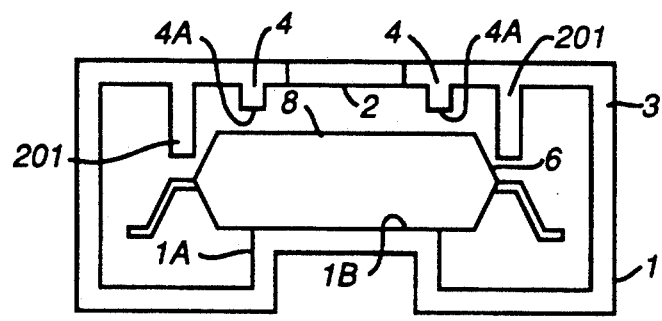
FIG._2
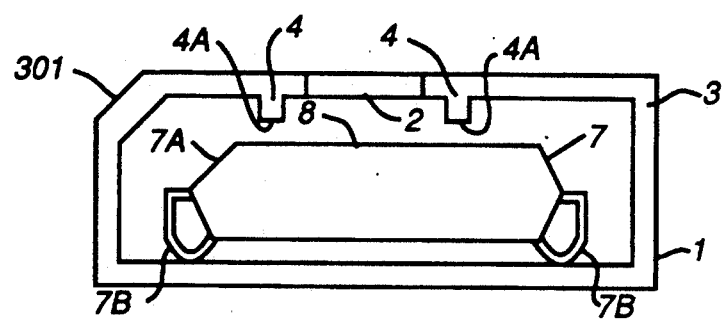
FIG._3

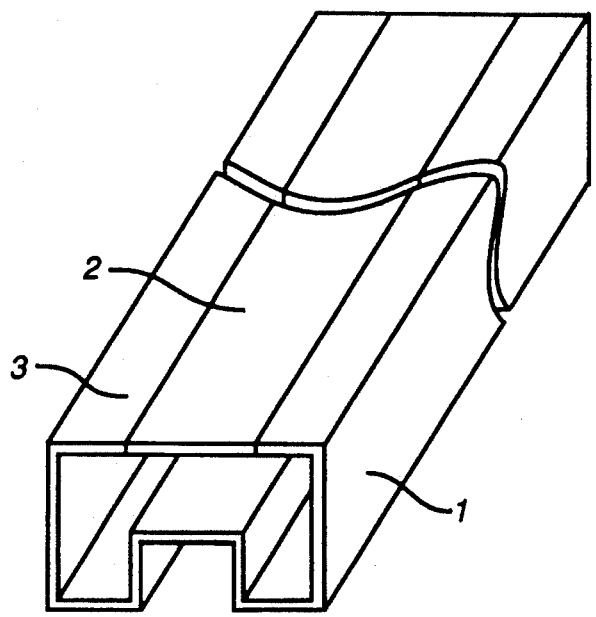
FIG._4
(PRIOR ART)
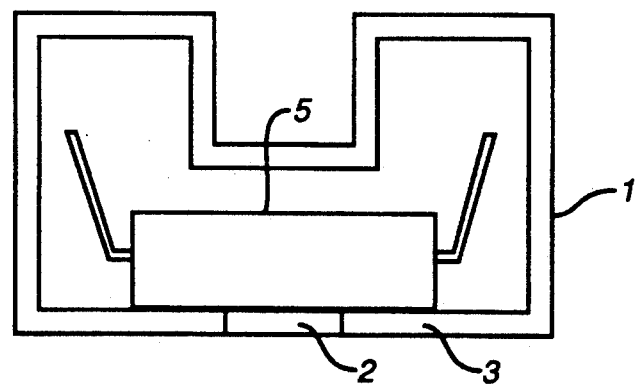
FIG._5
(PRIOR ART)

IC PACKAGE STORAGE CONTAINER

BACKGROUND OF THE INVENTION

This invention relates generally to storage containers and more particularly to containers designed for storing IC packages and IC package transport methods.

Tube-shaped storage containers of the prior art are generally shaped as shown in FIG. 4. Tube-shaped storage container 1 comprises a body section including a non-conductive transparent window 2 along the length of container 1 and a conductive portion 3 for purposes of grounding or otherwise removing generated static electricity from the IC packages stored in container 1.

As illustrated in FIG. 5, when storage container 1 containing IC packages 5 was inverted, contact and rubbing engagement between IC packages 5 and non-conductive transparent window 2 could not be avoided. Further, even if storage container 1 was carefully not inverted, vibration and movement during transport would result in such contact and rubbing engagement. As a result, the surface of IC packages 5 would become charged with static electricity and cause electrostatic damage to the IC chips sealed inside IC package 5.

The problem of static electricity generation relative to IC packages in such storage containers is the subject of Japanese Laid Open Utility Model Application 43911/89 to Okai et al., entitled, "Case for Storing Integrated Circuit Elements", published May 31, 1984. This Application discloses a storage container 10 having integrated conductive protrusions or projections 18 and 20 respectively in conductive regions or walls 15 and 19. Protrusions 18 and 20 were placed at strategic locations in the body of the IC container 10 in integrated combination with several transparent insulating, synthetic resin walls to aid in preventing IC packages 17 from becoming charged due to movement within container 10. Thus, IC packages 17 are supported for storage and transport by protrusions 18, providing for minimal contact area relative to container 10. As a result, static electricity was not easily generated since conductive protrusions functioned to ground any generated static electricity.

While Okai et al. was a step in the right direction, problems still remained. First, Okai et al. provided several transparent, insulating resin wall portions in the design of their container. These insulating portions of the container easily come in contact with corresponding insulating portions of other similar containers, such as during transport when several containers are packed together for shipment, or come in contact with other insulating objects and, in either case, causing the generation of static electricity and damage to the IC packages in the containers. The degree of damage caused by static electricity generated by contact between IC package containers can be just as bad as the damage caused by static electricity generated by contact between IC packages and insulating walls of an IC package container.

Secondly, the IC package containers of Okai et al. comprise a plurality of wall sections, some conductive resin and others insulating resin, that have to be bonded or otherwise secured together. In one example, there are eight such wall sections (FIGS. 4 and 5) and, in another example, there are twelve such wall sections. In the case of injection molding of such parts, it would be very difficult and expensive to mold together several different molded parts, particularly in the case of Okai et al. where the parts are alternated in conductive and insulating characteristics.

Third, the IC package containers of Okai et al. allow for lateral shifting of IC packages 17 permitting the leads of the packages to continuously engage the side walls of the container during transport which may bend the preformed IC package leads or even damage the packages per se.

It is an object of this invention to provide a container for the transport and storage of IC packages that is easy and cost effective to manufacture and yet insures the prevention of static electricity generation due to outside object engagement with the container as well as inside engagement of the IC packages with the container.

It is another object of this invention to provide a storage container for IC packages that concurrently prevents the contact or engagement of IC packages with nonconductive portions of the storage container and provides for minimum lateral movement of IC packages within the storage container.

It is another object of this invention to provide a method of transporting IC packages in a manner that prevents static electricity buildup on the IC packages due to container handling during their transport.

SUMMARY OF THE INVENTION

According to this invention, an IC package storage container has a conductive tubular-shaped body within which is housed a plurality of IC packages and includes a single non-conductive transparent window in one wall portion of the body. Thus, the container of this invention consists of only two molded parts and includes conductive protrusions or projections formed on and integral with the inside of the tubular-shaped body and extend into the interior of the container body to be in close proximity with a surface of the IC packages. These protrusions are formed on adjacent sides of the transparent window and arranged substantially parallel thereto for the length of the container body. The length of the protrusions are such that they concurrently prevent substantial lateral shifting and rotational orientation of the IC packages within the tubular-shaped container body and prevent any contact with the transparent window.

Thus, the IC package storage container of this invention prevents contact or rubbing engagement between the IC packages stored in the container and the non-conductive transparent window of the storage container during container transport of the IC packages by means of protrusions provided inside the storage container on adjacent sides of the transparent window. As a result, static charging of the surface of the IC packages is prevented and the packaged IC chips are protected from electrostatic damage.

Other objects and attainments together with a fuller understanding of the invention will become apparent and, appreciated by referring to the following description and claims taken in conjunction with the accompanying drawings.

BRIEF DESCRIPTION OF THE DRAWINGS

FIG. 1 is a cross-sectional view of an embodiment of the IC package storage container comprising this invention.

FIG. 2 is a cross-sectional view of another embodiment comprising this invention.

FIG. 3 is a cross-sectional view of a further embodiment comprising this invention.

FIG. 4 is an isometric view of an IC package storage container of the prior art.

FIG. 5 is a cross-sectional view of the storage container in FIG. 4 in an inverted state.

DESCRIPTION OF THE PREFERRED EMBODIMENTS

Reference is now made to FIG. 1 wherein there is shown a cross-sectional view of a first embodiment of this invention comprising tubular-shaped storage container 1 which is substantially C-shaped in cross sectional contour and has a non-conductive transparent window 2 in the back portion of container 1. The opposite wall of container 1 contains a platform 1A having a top surface 1B. The internal contour of container roughly conforms to the contour of IC packages 5 place within container 1. Window 2 is integral with the remaining conductive portion 3 of container 1. Adjacent to transparent window 2 and integral with the conductive portion 3 are protrusions or projections 4 extending into the interior or chamber of container 1. One or more IC packages, such as, DIP IC packages 5, are stored in container 1 in the manner illustrated in FIG. 1. Protrusions 4 prevent IC packages 5 from coming into contact with transparent window 2 as well as preventing lateral shifting and rubbing engagement of window 2 during movement and transport of IC packages 5 as contained in container 1. Since protrusions 4 are provided in conductive portion 3 of container 1, they are also conductive per se and, therefore, do not generate static electricity when IC packages 5 come in contact with them but rather maintain packages in contact with ground. Protrusions 4 are formed in substantially parallel rows along adjacent sides of transparent window 2.

Furthermore, the width, $W_2$, between protrusions 4 is greater than the width, $W_1$, of transparent window 2. Also, the width, $W_2$, is made to be sufficiently smaller than the width, Q, of IC packages 5 so that protrusions 4 will retain IC packages 5 from slipping off of top surface 1B of platform 1A even if a IC package 5 moves or is shifted laterally left or right within storage container 1. As an example, the width, $W_3$, of protrusions 4 need only be greater than 0.5 mm. The length or height, H, of protrusions 4 need only be greater than 0.5 mm. Thus, storage container 1 must be designed so that there is a gap of at least 0.5 mm between the ends 4A of protrusions 4 and top surface 8 of IC packages 5. In this way, the surface of packages 5 will be in potentially direct contact with protrusion ends 4A to prevent static electricity generation or build up since protrusions 4 will immediately place to ground any static electricity thereby preventing any damage to packaged IC chips from static electricity generation as well as preventing significant lateral shifting of said IC packages within the tubular-shaped body of container 1.

FIG. 2 is a cross-sectional view of another embodiment of this invention comprising tubular-shaped storage container 1 for SOP IC packages 6. The structure of FIG. 2 is substantially similar to the structure shown in FIG. 1 so that like elements carry the same numerical identification. However, FIG. 2 differs in that an extra set of projections or protrusions 201 are formed integral to conductive portion 3 of container 1 are adjacent to the first set of protrusions 4. Further, protrusions 201 are longer in length than protrusions 4 to prevent IC packages 6 from any significant lateral movement or shifting laterally within container 1 during their transport. Protrusions 4 prevent the leads from IC packages 6 from contacting or engaging the side walls of container 1 to prevent lead bending or damage to the package leads during their transport. Furthermore, protrusions 201 will engage the ends of packages 6 during any such laterally shifting in container 1 while placing to ground any static electricity developed on package 6 generated during the course of such shifting. Further, protrusions 201 prevent the preformed or contoured leads of IC packages 6 from being bent or deformed by engagement of the side walls of container 1.

FIG. 3 is a cross-sectional view of another embodiment of this invention for PLCC IC packages 7 which have a characteristic shape, in particular, the beveled edge 7A, which is indicative of the meaning of each of the terminals or terminal portions of packages 7. The structure of FIG. 3 is substantially similar to the structure shown in FIG. 1 so that like elements carry the same numerical identification. However, FIG. 3 differs from FIG. 1 in that storage container 1 is substantially rectangular in cross sectional contour and provided with a beveled wall portion or edge 301 which provides a visual indication to one holding or viewing container 1 as to the direction and orientation and/or the type of IC packages 7 contained within container 1.

The advantages of this invention, particularly over Okai et al., is the provision of a two piece container that is easy and inexpensive to manufacture since there are only two pieces to assemble for producting a container and the insulating window section is only one portion of side wall of the tubular-shaped container thereby significantly minimizing contact and rubbing of the insulating window of the container with other insulating container windows or walls, or other insulating objects in contact with the container. Also, means are provided to prevent lateral shifting of the IC packages within the container and insure against IC packages from becoming in any way engaged with the insulating window portion of the container or from bending or deforming the preshaped IC package leads caused by engagement with the side walls of the container.

While the invention has been described in conjunction with several specific embodiments, it is evident to those skilled in the art that many further alternatives, modifications and variations will be apparent in light of the foregoing description. Thus, the invention described herein is intended to embrace at such alternatives, modifications, applications and variations as fall within the spirit and scope of the appended claims.

What is claimed is:

1. An IC package storage container comprising
   a conductive tubular-shaped body within which is housed a plurality of IC packages,
   said tubular-shaped body having a non-conductive transparent window integral in one wall of said body,
   first conductive protrusions formed on and integral with the inside surface of said tubular-shaped body and extending into the interior of said body to close proximity with a surface of said IC packages,
   said protrusions formed on adjacent sides of said transparent window and arranged substantially parallel thereto, the ends of said protrusions extended to be sufficiently close to the surface of said IC packages limiting vertical shifting and rotational orientation of said IC packages within said tubular-shaped body and preventing their engagement with said transparent insulating window, two spatially disposed second conductive protrusions are provided on adjacent sides of said transparent window with one of each adjacent to one of said first protrusion and extending into the interior of said body, outer ends of said second protrusions being longer in length than said first protrusions to engage the ends of said packages and aid in preventing the lateral shifting of said IC packages in said container.

2. The IC package storage container of claim 1 wherein means are provide along an outer surface of said container body indicative of the orientation of said IC packages within said container.

* * * * *